US006993303B2

(12) United States Patent
Kwun

(10) Patent No.: US 6,993,303 B2
(45) Date of Patent: Jan. 31, 2006

(54) RADIO FREQUENCY SIGNAL ATTENUATION CIRCUITRY AND GAIN CONTROLLING UNIT

(75) Inventor: Soon-Ik Kwun, Seoul (KR)

(73) Assignee: LG Electronics Inc., Seoul (KR)

( * ) Notice: Subject to any disclaimer, the term of this patent is extended or adjusted under 35 U.S.C. 154(b) by 494 days.

(21) Appl. No.: 10/201,078

(22) Filed: Jul. 24, 2002

(65) Prior Publication Data

US 2003/0022642 A1    Jan. 30, 2003

(30) Foreign Application Priority Data

Jul. 25, 2001    (KR) ............................... 2001-44953

(51) Int. Cl.
   *H04B 17/02*    (2006.01)
(52) U.S. Cl. ................. 455/136; 455/232.1; 455/243.1
(58) Field of Classification Search ................ 455/136, 455/137, 138, 141, 219, 230, 232.1, 234.1, 455/237.1, 240.1, 241.1, 249.1, 255, 258, 455/259, 264
   See application file for complete search history.

(56) References Cited

U.S. PATENT DOCUMENTS

| 4,654,885 A | * | 3/1987 | Meszko et al. ............. 455/219 |
| 4,893,347 A | * | 1/1990 | Eastmond et al. .......... 455/506 |
| 6,684,065 B2 | * | 1/2004 | Bult et al. ............... 455/252.1 |
| 6,771,941 B2 | * | 8/2004 | Kim ....................... 455/127.2 |

* cited by examiner

*Primary Examiner*—Edward F. Urban
*Assistant Examiner*—Thuan Nguyen
(74) *Attorney, Agent, or Firm*—Fleshner & Kim, LLP

(57) ABSTRACT

The present invention avoids distortion in a radio frequency device due to a received RF signal which has a voltage strength that is too high. The invention comprises a radio frequency signal attenutation circuitry, a radio frequency signal processing circuitry, intermediate frequency processing circuitry, and a gain controlling unit. The gain controlling unit is configured to output a control signal to the radio frequency signal attenuation circuitry and intermediate frequency processing circuitry. The radio frequency signal attenuation circuitry is configured to attenuate a radio frequency signal prior to being processed by radio frequency processing circuitry and intermediate frequency processing circuitry. Accordingly, saturation in the radio frequency signal processing circuitry and intermediate frequency processing circuitry is avoided.

18 Claims, 3 Drawing Sheets

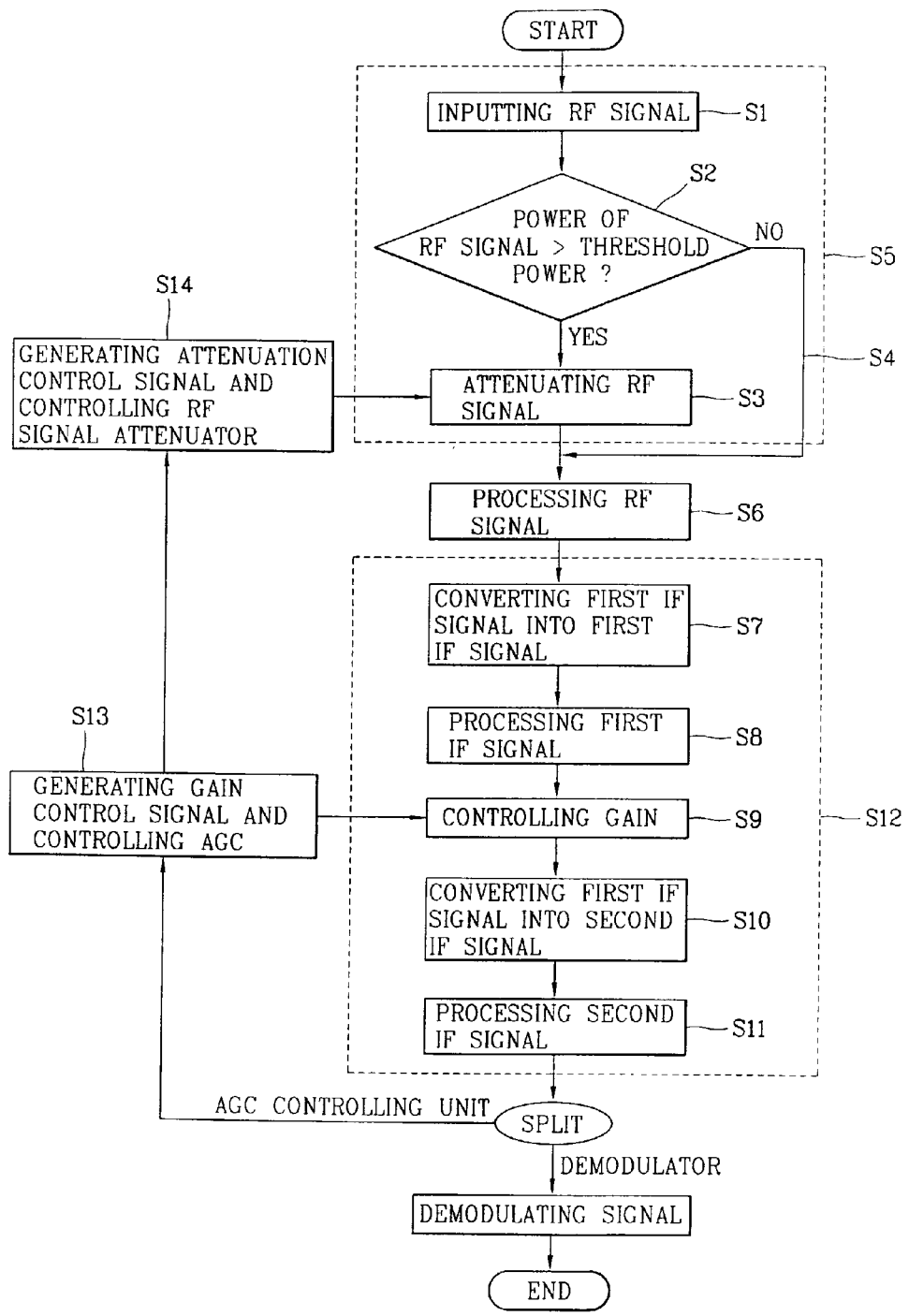

RADIO FREQUENCY SIGNAL ATTENUATION CIRCUITRY AND GAIN CONTROLLING UNIT

BACKGROUND OF THE INVENTION

1. Field of the Invention

The present invention relates to a gain controlling unit configured to output a control signal to radio frequency signal attenuation circuitry and intermediate frequency processing circuitry.

2. Background of the Related Art

Mobile radio communications systems are used in everyday life. Garage door openers, remote controllers for home entertainment equipment, cordless telephones, hand held walkie-talkies, pagers, and cellular telephones are all examples of mobile radio communications systems. The term mobile has historically been used to classify any radio terminal that can be moved during operation. More recently, the term mobile is used to describe a radio terminal that is attached to a high speed mobile platform (e.g., a cellular phone in a fast moving vehicle) whereas the term portable means a radio terminal that can be hand-held and used by someone at a walking speed (e.g., a walkie-talkie or cordless telephone inside a home). The term subscriber is often used to describe a mobile or portable user because in most mobile communications systems, each user pays a subscription fee to use the system, and each user's communication device is called a subscriber unit. In general, the collective group of users in a wireless system are called users or mobiles, even though many of the users may actually use portable terminals. The mobiles communicate to fixed base stations which are connected to a commercial power source and a fixed backbone network.

Many radio terminals both transmit and receive radio frequency signals. Due to changes of location or other environmental changes, the power level of the signals transmitted and received from radio terminals can vary. This can become problematic in radio terminals when the strength of a received radio frequency signal is too high. When the strength of such a radio frequency signal is too high, the radio terminal may not be able to process the signal properly. In these instances, a received radio signal may appear or sound distorted to a user. Particularly, when a radio terminal receives a high power radio frequency (RF) signal, the components of the radio terminal may become saturated and cause the undesirable distortion. Another disadvantage of a radio terminal receiving a high voltage signal is that the radio terminal may become disconnected, which is annoying to the user.

SUMMARY OF THE INVENTION

The object of the invention is to solve at least the above problems and/or disadvantages and to provide at least the advantages described hereinafter.

Accordingly, the object of the present invention is to avoid distortion at a radio terminal due to a received RF signal which has a voltage strength that is too high. Particularly, the present invention relates to an apparatus including radio frequency signal attenuation circuitry, radio frequency signal processing circuitry, intermediate frequency processing circuitry and a gain controlling unit. The gain controlling unit is configured to output a control signal to the radio frequency signal attenuation circuitry and intermediate frequency processing circuitry.

The present invention utilizes the radio frequency attenuation circuitry to lower the strength of a received radio frequency signal which is too high. This is advantageous, as once a relatively high radio frequency signal is attenuated, the radio frequency signal processing circuitry and intermediate frequency processing circuitry can adequately process the received signal without producing distortion. In other words, prior to a relatively high voltage radio frequency signal being processed by a radio terminal, the radio frequency signal is selectively reduced to a reasonable level. Control of the radio frequency signal attenuation circuitry is accomplished by the gain controlling unit.

In embodiments of the present invention the signal attenuation circuitry includes a radio frequency signal attenuator and a scaling unit. The scaling unit may include a first amplifier, a second amplifier, and a Zener diode. In embodiments, the first amplifier is configured to output a first signal. The first signal is an amplification of a voltage difference between the control signal from the gain controlling unit and a reference signal. In these embodiments, the second amplifier is configured to output an attenuation control signal. The attenuation control signal is an amplification of the first signal output from the first amplifier. Also in these embodiments, the Zener diode is configured to limit the voltage level of the attenuation control signal. In embodiments of the present invention, the reference voltage is generated by a voltage generator that includes a variable resistor. In other embodiments of the present invention the scaling unit is configured to input a signal having a voltage greater than approximately 2.5 Volts and less than approximately 8 Volts. In these embodiments, the scaling unit is configured to output a signal having a voltage greater than approximately 0.7 Volts and less than approximately 4.7 Volts.

In embodiments of the present invention, the output of the radio frequency attenuation circuitry is input into the radio frequency processing circuitry. The output of the radio frequency signal processing circuitry is input into the intermediate frequency processing circuitry. The output of the intermediate frequency processing circuitry is input into the gain controlling unit. The output of the gain controlling unit is input into both the scaling unit and the intermediate frequency processing circuitry.

In embodiments of the present invention the output of the radio frequency signal attenuator is input into the radio frequency processing circuitry. The output of the radio frequency signal processing circuitry is input into the intermediate frequency processing circuitry. The output of the intermediate frequency processing circuitry is input into the gain controlling unit. The output of the gain controlling unit is input into both the scaling unit and the intermediate frequency processing circuitry. The output of the scaling unit is input into the radio frequency signal attenuator.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 3 is a flow chart of a method in accordance with the present invention.

DETAILED DESCRIPTION OF PREFERRED EMBODIMENTS

Figure 1:
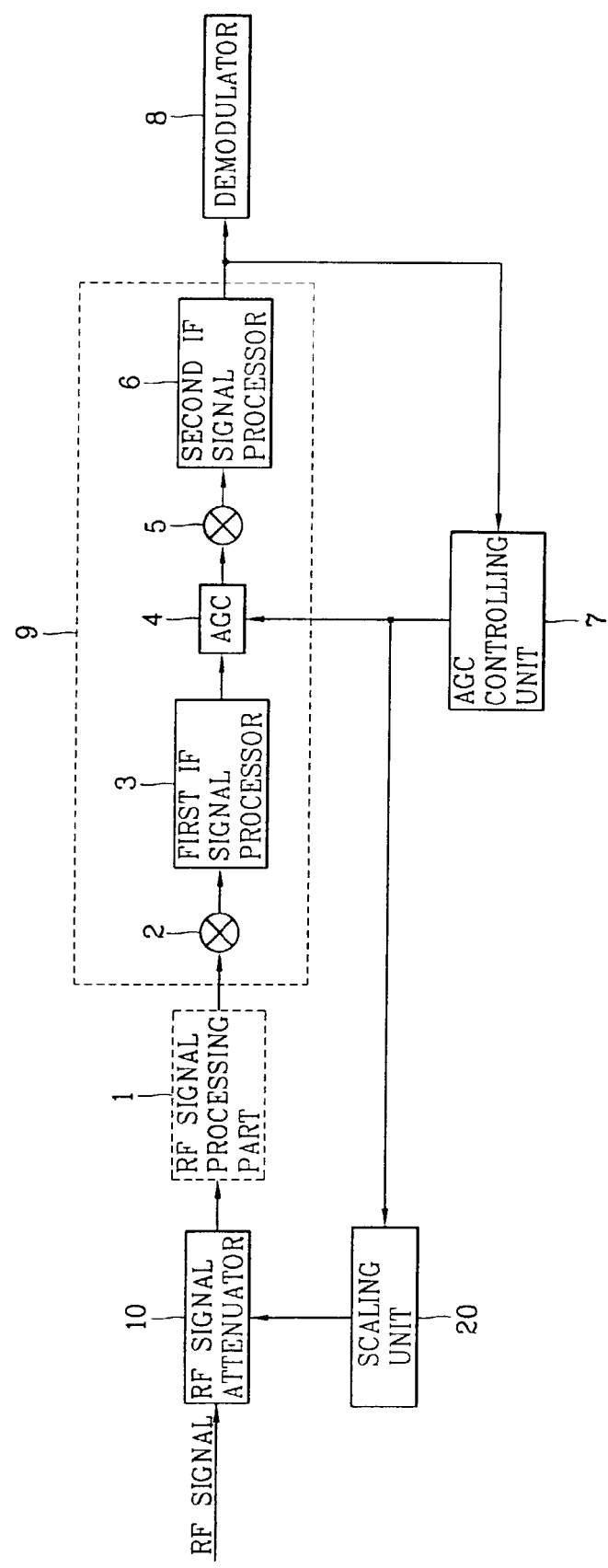
FIG. 1 is a block diagram of an apparatus including a scaling unit in accordance with the present invention.

FIG. 1 is a block diagram of an exemplary automatic gain control apparatus. The apparatus includes a Radio Frequency (RF) signal attenuator 10, a RF signal processing part or processor 1, an Intermediate Frequency (IF) processing part or processor 9, demodulator 8, automatic gain control (AGC) controlling unit or controller 7, and scaling unit or scaler 20. The RF signal processing part 1 is configured to receive and process RF signals output from RF signal attenuator 10. The IF signal processing part 9 is configured to convert the processed RF signal output from RF signal processing part 1 to generate an IF signal. Automatic Gain Controller (AGC) controlling unit 7 is configured to generate a gain control signal. The gain control signal is in accordance with a difference between a voltage level of an output signal of the IF signal processing part 9 and a reference voltage level. Scaling unit 20 is configured to scale the gain control signal output from AGC controlling unit 7 and generate an attenuation control signal. RF signal attenuator 10 is configured to attenuate a RF signal input into the RF signal attenuator 10 according to the attenuation control signal. The attenuator control signal is output from scaling unit 20.

The IF signal processing part 9 includes a first mixer 2, a first IF signal processor 3, an AGC 4, a second mixer 5, and a second IF signal processor 6. The first mixer 2 is configured to convert the RF signal output from RF signal processing part 1 into a first IF signal. First IF signal processor 3 is configured to remove harmonic components from the first IF signal and amplify the first IF signal to a processable power level. The AGC 4 is configured to control the gain of the amplified first IF signal according to the gain control signal output from AGC controlling unit 7. The second mixer 5 is configured to convert the gain-controlled first IF signal into a second IF signal. The second IF signal processor 6 is configured to filter and amplify the converted second IF signal.

Figure 2:
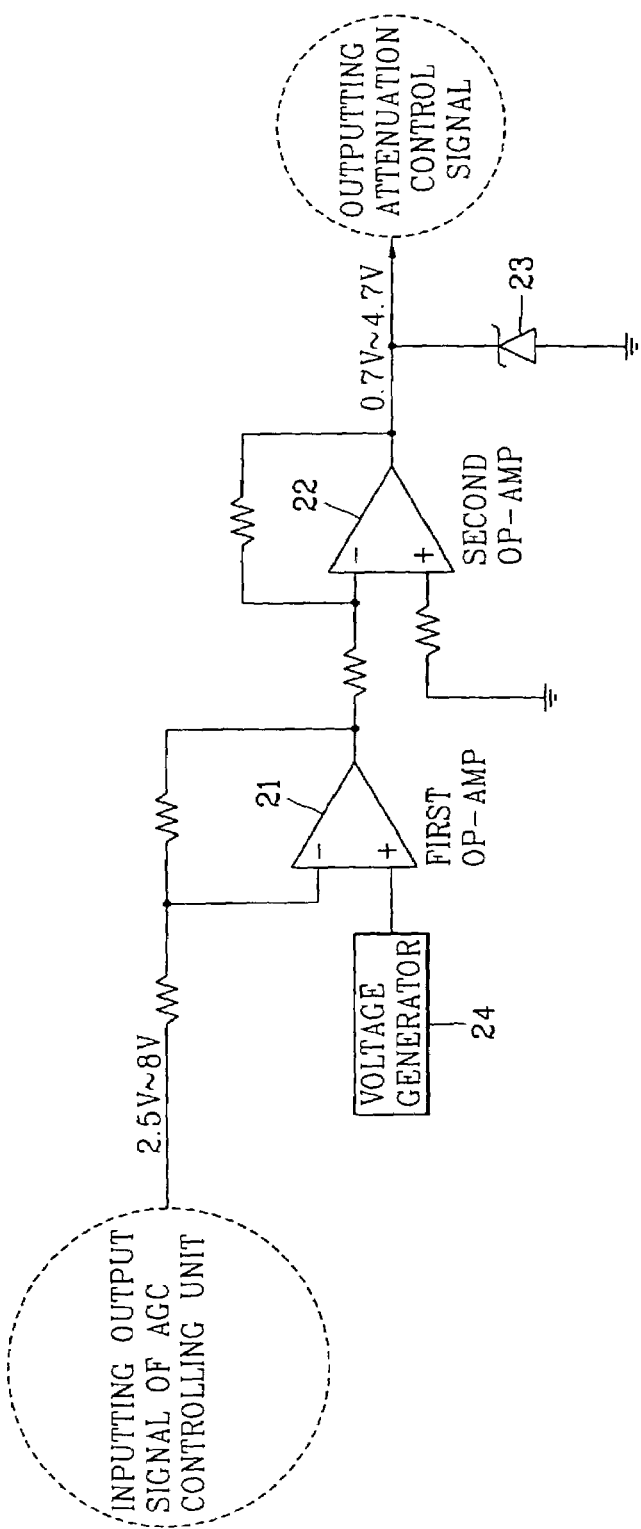
FIG. 2 is a detailed block diagram of the scaling unit.

FIG. 2 is a detailed block diagram of the exemplary scaling unit illustrated in FIG. 1. The scaling unit 20 includes a first calculation amplifier 21, a second calculation amplifier 22, and a Zener diode 23. The first calculation amplifier 21 is configured to amplify a gain control signal input into the inversion terminal and a reference voltage input into the non-inversion terminal.

The second calculation amplifier 22 is configured to amplify the output signal of the first calculation amplifier 21, which is input into the inversion terminal. A ground voltage is input into the non-inversion terminal. The output of the second calculation amplifier 22 is an attenuation control signal. The Zener diode 23 is for limiting the voltage level of the attenuation control signal. The scaling unit 20 further includes a voltage generator 24 for generating the reference voltage.

FIG. 3 is a flow chart of a method in accordance with the present invention. The method includes multiple steps. Step S3 is attenuating an inputted RF signal according to an attenuation control signal. Step S3 is performed when the power of the RF signal is higher than a threshold power. Step S6 is processing the attenuated RF signal according to an RF signal processing routine. Step S12 is generating an IF signal by down-converting the RF signal and processing the generated IF signal according to an IF signal processing routine. Step S13 is generating a gain control signal according to a difference between a voltage level of the processed IF signal and a reference voltage level. Step S9 is controlling a gain of the generated IF signal with the gain control signal. Step S14 is scaling the gain control signal and generating an attenuation control signal to control the RF attenuation operation.

Step S12 includes multiple steps S7 through S11. Step S7 is converting the processed RF signal into a first IF signal. Step S8 is removing harmonic components from the first IF signal and amplifying the first IF signal to have adequate power. Step S9 is controlling a gain of the amplified first IF signal according to a gain control signal. The gain control signal is according to step S13. Step S10 is converting the gain-controlled first IF signal into a second IF signal. Step S11 is filtering and amplifying the converted second IF signal.

In embodiments of the present invention, the exemplary method illustrated in FIG. 3 is related to the exemplary apparatus illustrated in FIGS. 1 and 2. Prior to an RF signal input into RF signal attenuator 10, RF signal may be processed in a low noise amplifier (LNA). At the RF signal attenuator 10, the RF signal is gain controlled, as shown in step S5. Particularly, the RF signal is attenuated. The gain control of the RF signal at the RF signal attenuator is in accordance with the control signal from scaling unit 20.

The gain controlled RF signal is transmitted to the RF signal processing part 1. At the RF signal processing part 1, a signal of a predetermined band from the received RF signal is extracted and amplified, as shown in step S6. The RF signal outputted from the RF signal processing part 1 is converted into a first IF signal by first mixer 2 and transmitted to the first IF processor 3, as shown in step S7. First IF processor 3 removes undesirable harmonic components of the first IF signal. The first IF processor 3 also filters and amplifies the first IF signal to have adequate power, as shown in step S8.

A signal processed at the first IF processor 3 is inputted to the AGC 4. The AGC 4 controls a gain of the input signal and outputs it to the second mixer 5, as shown in step S9. The second mixer 5 mixes an intermediate frequency to the inputted signal to generate a second IF signal, as shown in step S10. The generated second IF signal is then transmitted to the second IF processor 6. The second IF processor 6 filters and amplifies the received IF signal and is then input into the demodulator 8 and the AGC controlling unit 7, as shown in step S11.

A sensor (not shown) of the AGC controlling unit 7 converts the applied IF signal into a DC voltage. The integrator (not shown) of the AGC controlling unit 7 compares the converted DC voltage with a reference voltage and generates an automatic gain control DC voltage. The automatic gain control DC voltage is a gain control signal in accordance with a difference ($\Delta$) between the voltage levels of the converted DC voltage and the reference voltage. The generated gain control signal is applied to the AGC 4 and the scaling unit 20, as shown in step S13. The AGC 4 controls a gain of the first IF signal according to the output signal (or the gain control signal) from the AGC controlling unit 7. The scaling unit 20 converts the applied gain control signal to generate an attenuation control signal. Accordingly, the scaling unit 20 controls the operation of the RF signal attenuator 10 with the generated attenuation control signal, as shown in step S14.

A circuit used for the RF signal attenuator 10 may be included on a semiconductor chip. One of ordinary skill and art would appreciate that there are various types of circuits having different precision degrees, linearization, and available maximum processing power. One of ordinary skill and art would select a chip suitable for a given system environment.

As shown in FIG. 2, the scaling unit 20 is implemented by calculation amplifiers 21 and 22. Amplifiers 21 and 22 scale the output signal from AGC controlling unit 7 and map it at a predetermined voltage levels. In one exemplary embodiment, the scaling unit 20 maps a 2.5V~8V signal to a 0.7V~4.7V signal. In other words, the scaling unit 20 receives a signal in the range of 2.5V~8V and outputs a signal of a corresponding voltage in the range of 0.7V~4.7V.

The first calculation amplifier 21 of the scaling unit 20 inputs the output signal of the AGC controlling unit 7 at the inversion terminal. The amplifier 21 inputs the reference voltage at the non-inversion terminal. Accordingly, amplifier 21 amplifies the difference of the output signal of the AGC controlling unit 7 and the reference voltage. The second calculation amplifier 22 inputs the output signal of the first calculation amplifier 21 at amplifier 22's inversion terminal. A ground voltage is input into non-inversion terminal of amplifier 22. Accordingly, in this exemplary embodiment, amplifier 22 outputs an attenuation control signal in the range of 0.7V~4.7V.

A voltage generator 24 generates the reference voltage input into the non-inversion terminal of the first calculation amplifier 21. The voltage generator 24 includes a variable resistor (not shown). The scaling unit 20 includes the Zener diode 23 at the output side of the second calculation amplifier 22, so as to limit the voltage of the output signal. In an exemplary embodiment, the output signal is limited to 5V. The reference voltage is in accordance with the variable resistor of the voltage generator 24.

The variable resistor in the scaling unit 20 controls the first calculation amplifier 21 such that, if power of the RF signal inputted to the RF attenuator 10 is above a predetermined level, then the RF signal attenuator 10 performs signal attenuation according to a control signal of the scaling unit 20. In exemplary embodiments, the predetermined level is −40 dBm. Accordingly, if power of the RF signal inputted to the RF attenuator 10 is below the predetermined level, then the RF signal attenuator 10 does not perform signal attenuation.

Throughout this process, the predetermined level or threshold power is set to the signal power attenuation. Accordingly, saturation of a internal circuit due to the influx of a high power RF signal can be prevented. Further, a RF signal below the threshold power is not attenuated. The Applicants conducted experiments exhibiting minimal signal distortion when the power of a receive signal was 20 dBm. This is significant as the typical prior art circuit can only withstand a received signal having a maximum power strength of −20 dBm.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An apparatus comprising: radio frequency (RF) signal processing circuitry configured to receive and process an RF signal;
   intermediate frequency (IF) processing circuitry configured to receive the processed RF signal and generate an IF signal;
   a gain controlling unit configured to output a control signal to the intermediate frequency processing circuitry to control a gain of the IF signal;
   a scaling unit configured to scale the control signal output by the gain controlling unit so as to generate an attenuation control signal; and
   an RF signal attenuation unit configured to attenuate the RF signal input to the RF signal processing circuitry based on the attenuation control signal generated by the scaling unit.

2. The apparatus of claim 1, wherein the scaling unit comprises:
   a first amplifier configured to output a first signal, wherein the first signal is an amplification of a voltage difference between the control signal and a reference signal;
   a second amplifier configured to output an attenuation control signal, wherein the attenuation control signal is an amplification of the first signal; and
   a Zener diode configured to limit the voltage level of the attenuation control signal.

3. The apparatus of claim 2, wherein the Zener diode limits the voltage level of the attenuation control signal to 5 volts.

4. The apparatus of claim 2, wherein the reference voltage is generated by a voltage generator comprising a variable resistor.

5. The apparatus of claim 1, wherein:
   the scaling unit is configured to input a signal having a voltage greater than approximately 2.5 Volts and less than approximately 8 Volts; and
   the scaling unit is configured to output a signal having a voltage greater than approximately 0.7 Volts and less than approximately 4.7 Volts.

6. The apparatus of claim 1, wherein:
   the radio frequency signal attenuator is a semiconductor device.

7. The apparatus of claim 1, wherein:
   an output of the RF signal attenuation unit is input into the radio frequency signal processing circuitry;
   an output of the radio frequency signal processing circuitry is input into the intermediate frequency processing circuitry;
   an output of the intermediate frequency processing circuitry is input into the gain controlling unit; and
   an output of the gain controlling unit is input directly into both the scaling unit and the intermediate frequency processing circuitry.

8. The apparatus of claim 7, wherein:
   an output of the scaling unit is directly input into the radio frequency signal attenuator.

9. A method comprising:
   inputting a first signal into radio frequency signal attenuation circuitry;
   outputting a second signal from the radio frequency signal attenuation circuitry;
   inputting the second signal into radio frequency signal processing circuitry;
   outputting a third signal from the radio frequency signal processing circuitry;
   inputting the third signal into intermediate frequency processing circuitry;
   outputting a fourth signal from the intermediate frequency processing circuitry;
   inputting the fourth signal into a gain controlling unit; and
   outputting a fifth signal from the gain controlling unit into both the radio frequency signal attenuation circuitry and the intermediate frequency processing circuitry;

wherein inputting the first signal comprises:
scaling the fifth signal output from the gain controlling unit so as to generate an attenuation control signal; and
attenuating the first signal input into the radio frequency attenuation circuitry based on the generated attenuation control signal.

10. The method of claim 9, wherein the radio frequency signal attenuation circuitry comprises:
a radio frequency signal attenuator; and
a scaling unit.

11. The method of claim 10, wherein the scaling unit comprises:
a first amplifier;
a second amplifier; and
a Zener diode.

12. The method of claim 11, further comprising:
outputting a sixth signal from the first amplifier, wherein the sixth signal is an amplification of a voltage difference between the fifth signal and a reference signal;
outputting a seventh signal from the second amplifier, wherein the seventh signal is an amplification of the first signal; and
limiting the voltage level of the seventh signal at the Zener diode.

13. The method of claim 12, wherein the Zener diode limits the voltage level of the seventh signal to 5 volts.

14. The method of claim 12, wherein the reference voltage is generated by a voltage generator comprising a variable resistor.

15. The method of claim 10, wherein:
the fifth signal has a voltage greater than approximately 2.5 Volts and less than approximately 8 Volts; and
the seventh signal has a voltage greater than approximately 0.7 Volts and less than approximately 4.7 Volts.

16. The method of claim 10, wherein the radio frequency signal attenuator is a semiconductor device.

17. The method of claim 10, further comprising:
inputting the fifth signal into the scaling unit; and
outputting an eighth signal into the radio frequency signal attenuator.

18. An apparatus comprising:
radio frequency signal processing circuitry; and
means for minimizing distortion caused by a high gain radio frequency signal input into the radio frequency signal processing circuitry;
wherein the means for minimizing distortion comprises:
intermediate frequency (IF) processing circuitry configured to receive the processed RF signal and generate an IF signal,
a gain controlling unit configured to output a control signal to the IF processing circuitry to control a gain of an IF signal output by the IF processing circuitry,
a scaling unit configured to scale the control signal output by the gain controlling unit so as to generate an attenuation control signal, and
an RF signal attenuation configured to attenuate an RF signal input to the RF signal processing circuitry based on the attenuation control signal generated by the scaling unit to minimize the distortion caused by the high gain frequency signal input to the radio frequency signal processing circuitry.

* * * * *